United States Patent [19]

Crispin et al.

[11] Patent Number: 4,953,277
[45] Date of Patent: Sep. 4, 1990

[54] MANUFACTURING PROCESS FOR AN ELECTRONIC DEVICE

[75] Inventors: Norbert Crispin, Markgroeningen; Hartmut Schumacher, Stuttgart; Harald Vogt, Schwieberdingen; Rudolf Eisenbarth, Salzgitter, all of Fed. Rep. of Germany

[73] Assignee: Robert Bosch GmbH, Stuttgart, Fed. Rep. of Germany

[21] Appl. No.: 390,644

[22] Filed: Aug. 7, 1989

[30] Foreign Application Priority Data

Aug. 26, 1988 [DE] Fed. Rep. of Germany ....... 3828988

[51] Int. Cl.$^5$ .............................................. B23P 21/00
[52] U.S. Cl. .................... 29/407; 29/402.01; 29/593
[58] Field of Search ...................... 29/407, 593, 402.01

[56] References Cited

U.S. PATENT DOCUMENTS 4,488,354 12/1984 Chan et al. ............................ 29/593
4,560,583 12/1985 Mousvold .......................... 24/593 X

FOREIGN PATENT DOCUMENTS 2547110 3/1978 Fed. Rep. of Germany .

OTHER PUBLICATIONS

"Feinwerktechnik und Messtechnik" (Precision Engineering and Metrology) 96 (1988) 5, pp. 209, 210.

Primary Examiner—Timothy V. Eley
Attorney, Agent, or Firm—Kenyon & Kenyon

[57] ABSTRACT

A manufacturing process for an electronic device having a storage element, whereby, in various manufacturing stages, the device runs through testing stations. After passing through a testing station, information documenting the respective inspection step is stored in the storage element of the electronic device.

10 Claims, 2 Drawing Sheets

MANUFACTURING PROCESS FOR AN ELECTRONIC DEVICE

BACKGROUND OF THE INVENTION

In the case of electronic subassemblies used for safety purposes, for example, in automotive and aerospace applications, it has proven worthwhile to test the subassemblies themselves, as well as each individual component of the subassembly, and to record the manufacturing and test steps using process cards. On the one hand, these records help to insure a manufacturing method which is free of errors, and consequently products, which are free of defects; on the other hand, the test reports make error analyses possible, in case errors should occur later on. Evidently, these strict manufacturing and test specifications are extremely expensive and time-consuming and make the product itself more expensive. In addition, the test documents accompanying the product, in the case of complex subassemblies, are very voluminous and require considerable storage space and administrative work on the part of the manufacturer and user of the subassembly.

Furthermore, it is a known procedure from the periodical "Feinwerktechnik und Messtechnik" (Precision Engineering and Metrology) 96 (1988) 5, pages 209 and 210, to test automatically electronic subassemblies for automotive electronics on computer controlled test stands and to transmit the test results through a network to a master computer, which files these test results in a data bank system for repair purposes.

SUMMARY OF THE INVENTION

It is an object of the present invention to provide a manufacturing process for an electronic device which helps to insure a manufacturing method which is free of errors, and consequently products which are free of defects.

It is also an object of the present invention to reduce the amount of paperwork and documentation required when testing electronic devices.

It is furthermore an object of the present invention to store information relating to the testing of a device in a storage element of the device after a test has been completed.

It is yet still a further object to detect when errors or faults have occurred and to allow remedial or further testing action to occur on the device, as necessary.

The above and other objects of the present invention are achieved by a manufacturing process for an electronic device having a storage element, whereby during various manufacturing stages, the device runs through testing stations, wherein after passing through one testing station, information documenting the respective inspection step is stored in the storage element of the electronic device.

The solution, according to the invention, has the advantage that, during the manufacturing process, an automatic monitoring of the inspection and test sequence is performed and it is thereby guaranteed that each test stand passes through properly. By this means, in an especially simple and efficient way, the quality of the electronic devices can be improved. In addition, the method of the invention makes it possible for all inspection and test sequences and their results to be stored in the storage element of the electronic device, so that the electronic device carries along with it documentation concerning its manufacturing process. If errors should occur later, during the operation of the electronic device, it can be checked if the cause of the error can be attributed to defects in the manufacturing process of the electronic device.

BRIEF DESCRIPTION OF THE DRAWINGS

The invention will be described in greater detail in the following detailed description with reference to the drawings, in which.

DETAILED DESCRIPTION

Figure 1:
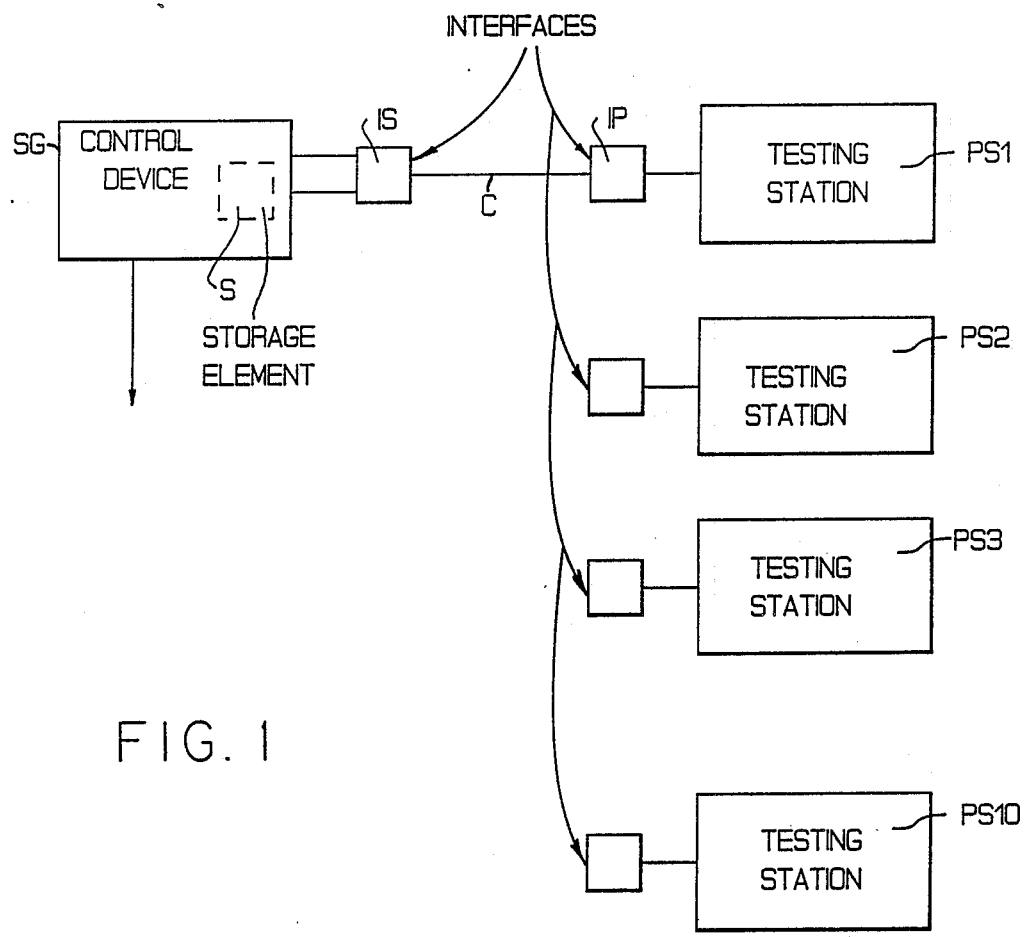
FIG. 1 is a schematic representation of an electronic device with a storage element and several test stands.

With reference now to the drawings, FIG. 1 depicts a schematic representation of an electronic device, for example a control device SG, which serves to release restraining means for automobile passengers. It can be conveyed to several testing stands or stations PSI to PS10 during the manufacturing process for inspection. At least one storage element S is arranged in the control device SG. This storage element is required for the later functioning of the control device. During a test procedure, the control device SG and one of the testing stations PSI are interconnected by way of interfaces IS, IP and connecting lines C. After terminating a test procedure within the scope of the manufacturing process at the testing station PSI, for example, the control device SG is conveyed to the following testing stations PS2, PS3 to PS10, one after the other, so further test procedures can be performed.

Figure 2:
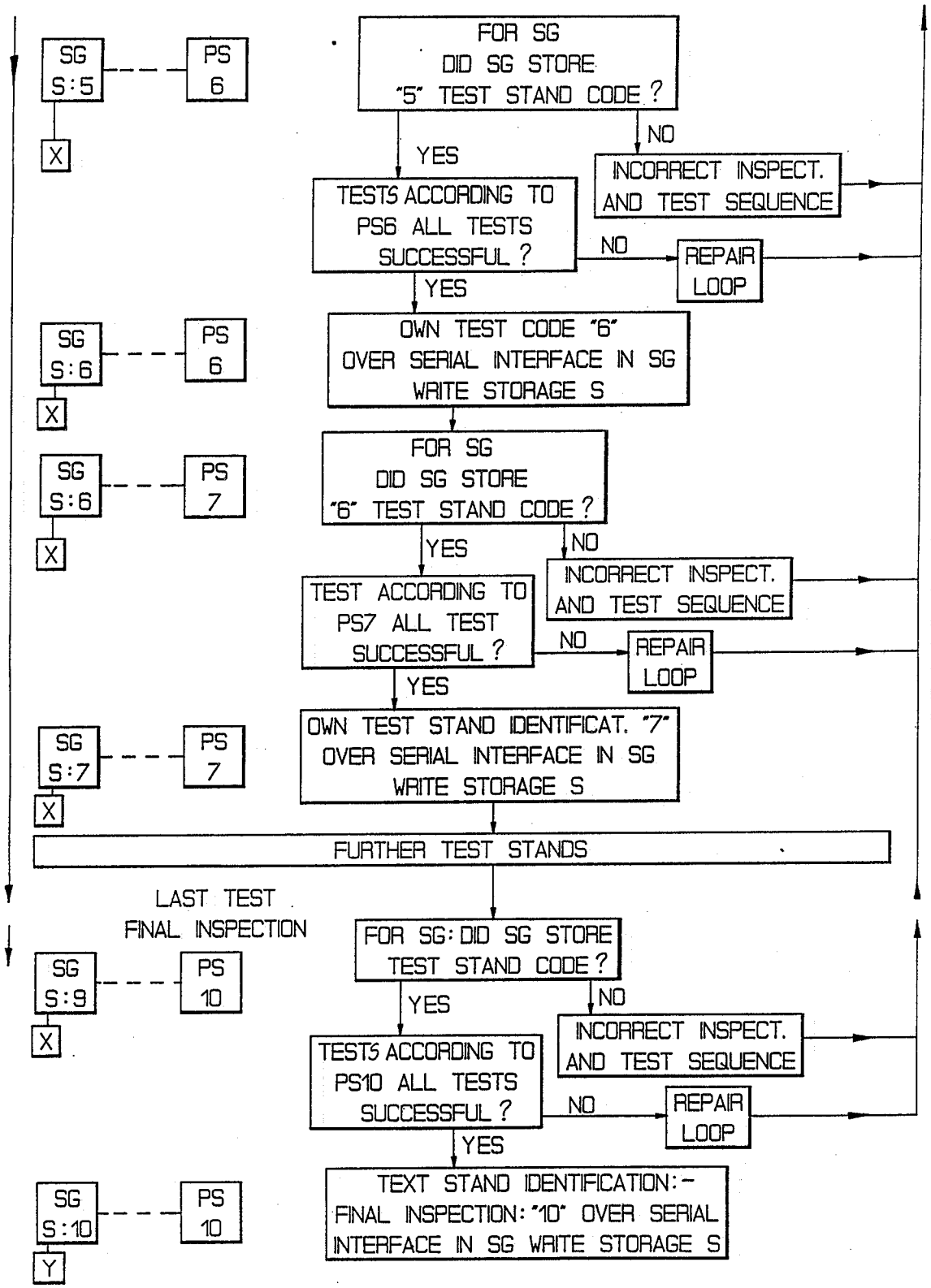
FIG. 2 shows a sequence chart to clarify the testing of the electronic device.

Based on the sequence chart depicted in FIG. 2, the implementation of the testing process at various testing stations is clarified further. The sequence chart thereby represents one portion of the testing processes, which take place at the testing stations PS6 to PS10. The control device SG is conveyed to the testing station PS6, after first passing through the preceding testing stations PSI, PS2, PS3, PS4 and finally PS5. Provided that the testing procedure has been properly executed in the testing station PS5, apart from possibly the testing procedure and information documenting the test results, a code specific to the test stand PS5 ("a test stand identification") is stored, in accordance with the invention, in the storage element S of the control device SG. In this case, the code is only reproduced symbolically in a shortened version with the ordinal number "5". As soon as the control device SG is conveyed to the testing station PS6, the testing station PS6 first scans the contents of the storage element of the control device SG and tests, if the test stand code for the testing station 5 is stored in the storage element S, whereby this code indicates proper inspection in this last mentioned testing station. If this test stand code from the testing station 5 is not recognized, it is concluded that a faulty testing procedure took place and the control device SG is first separated and possibly once more conveyed to the preceding testing station PS5. If, on the other hand, the existence of the test stand code 5 is determined in the storage element S of the control device SG, the control device SG is then subjected to the inspection steps, for which the testing station PS6 is responsible. Provided that the control device SG successfully passes all of the designated tests in the testing station PS6, a test stand code again characterizing the test stand PS6, represented in this case symbolically by the number "6", is stored in the storage element S of the control device SG. If, during the implementation of the test procedures in the testing station PS6, it should turn out that a testing procedure cannot be successfully terminated, it is concluded that there is a defect in the control device SG, with the result that the control device SG is removed from the inspection and test sequence and possibly conveyed first of all to a repair loop. The attempt is made in this repair loop to locate and repair the defect which has appeared. Next, according to the error involved, the repaired control device SG is conveyed again to the appropriate testing station. After successfully concluding all testing procedures in the testing station PS6, the properly tested control device SG, which has been diagnosed as good, is conveyed to further testing stations PS7, PS8, PS9, not shown in their entirety in the sequence chart of FIG. 2. Finally, after a successful check test in the testing station PS9, the control device SG is conveyed to the last test stand PS10, where the final inspection is made. When the control device SG also successfully completes all the tests in this test stand PS10, a corresponding test stand code is stored in the storage element S of the control device SG. This code indicates that the control device SG has successfully run through all of the test stands. Apart from the test stand code for the test stand PS10, information concerning the total inspection and test sequence and the thereby measured characteristic values of the control device SG are expediently stored in the storage element of the control device SG. The control device SG consequently carries with it a complete documentation concerning the manufacturing process and the testing procedures implemented during the manufacturing process. In case of a later failure of the control device during its normal operation, it can then be determined, if necessary, if the failure can be attributed to errors caused during the manufacturing of the control device SG. This testing possibility is extremely significant in the case of electronic devices used for safety purposes, such as, for example, control devices for restraining systems for automobile passengers, since after the occurrence of an accident, liability claims are often filed against the automobile manufacturer.

If the storage element S of the control device SG only has a limited storage capacity and, in addition to this, almost all of this storage capacity is needed during the normal operation of the control device SG, it is, of course, possible to dispense with storing the complete documentation concerning the test procedures and the thereby obtained measured values and only to retain the successful completion of all inspection and test sequences in a shortened coding in the storage element S.

The information stored in the storage element S concerning the implementation of the inspection and test sequences is also expediently protected from unauthorized access, to permanently secure this information. This protection can, for example, be effected by preventing access to the storage areas of the storage element S, in which this special data is stored, by properly designing the connectors of the interface IS of the control device SG. Furthermore, through circuit engineering and/or software measures, an unauthorized person, who attempts to scan the storage contents of the storage element S, can also be prevented from gaining access to this protected data.

In order to be able to also recognize the current inspection status without electronic evaluation of the memory contents of the storage element S of the control device SG, in addition, a marking is expediently applied to facilitate the operation. This marking allows the inspection status to be recognized externally as well. In this connection, it can be a question of, for example, a marking with colored dots, colored bars and/or possibly a bar coding readable by a bar-code laser. Such an additional marking proves to be effective, at least in the case of those control devices SG, which have successfully passed through the last test stand PS10.

Often the control device SG comprises a warning device, such as, for example, a warning light, a beeper or the like, so that if an error occurs during normal operation of the control device SG, the driver of a vehicle, for example, is made aware of a defect in the control device SG. Expediently, these warning devices are now used to inform the test stand operators of an error in the control device SG. An error should at least be indicated when the last testing procedure is implemented in the test stand PS10 For this purpose, the control device SG is provided with evaluating means, to evaluate the test stand code and, in case of an error, to activate the warning device.

The method of the invention was explained based on the example of a control device SG for restraining means for automobile passengers. The method can also be applied, of course, in the same way for control devices used in other application fields, for example, brake controls.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A manufacturing process for an electronic device having a storage element, comprising testing the device during a plurality of manufacturing stages at respective testing stations, and after being tested at a respective testing station, storing information relating to an inspection step performed at the respective inspection station in the storage element of the electronic device.

2. The process recited in claim 1, wherein the step of storing comprises storing information in the storage element of the electronic device comprising specific characteristic values for the respective testing station.

3. The manufacturing process recited in claim 1, wherein the step of storing comprises storing information in the storage element of the electronic device comprising specific characteristic values for the control device.

4. The manufacturing process recited in claim 3, wherein the specific characteristic values comprise characteristic values detected in the testing stations.

5. The process recited in claim 1, further comprising the step of detecting an error if an error occurs, and conveying the test piece, in accordance with the detected error, to a testing or repair station.

6. The process recited in claim 1, further comprising applying a marking to the device in addition to storing the information in the storage element.

7. The process recited in claim 6, wherein the marking is visible.

8. The process recited in claim 6, wherein the marking is legible.

9. The process recited in claim 1, wherein tolerance ranges are provided for the characteristic values specific to the device, and further comprising that when a tolerance range is not observed, removing the tested device at least temporarily from the process and conveying the device to a repair loop to be repaired.

10. The process recited in claim 1, wherein the device is equipped with a warning device, and further comprising detecting the information specific to the testing station and controlling the warning device when the information specific to the testing station is not recognized.

* * * * *